(12) United States Patent
Ichikawa

(10) Patent No.: US 8,710,543 B2
(45) Date of Patent: Apr. 29, 2014

(54) CASCODE CIRCUIT DEVICE WITH IMPROVED REVERSE RECOVERY CHARACTERISTIC

(75) Inventor: Yuhji Ichikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/459,993

(22) Filed: Apr. 30, 2012

(65) Prior Publication Data
US 2012/0280271 A1 Nov. 8, 2012

(30) Foreign Application Priority Data

May 6, 2011 (JP) ................................. 2011-103529

(51) Int. Cl.
*H01L 29/66* (2006.01)
(52) U.S. Cl.
USPC ........... 257/134; 257/133; 257/615; 327/430; 327/434
(58) Field of Classification Search
USPC ........... 257/133, 134, E29.217; 327/427–430
See application file for complete search history.

(56) References Cited

U.S. PATENT DOCUMENTS

| 6,633,195 B2 | 10/2003 | Baudelot et al. | |
|---|---|---|---|
| 2005/0225373 A1 | 10/2005 | Morita | |
| 2006/0022276 A1* | 2/2006 | Park et al. | 257/368 |
| 2011/0134675 A1* | 6/2011 | Grbovic | 363/127 |
| 2011/0210337 A1* | 9/2011 | Briere | 257/76 |
| 2012/0105131 A1* | 5/2012 | Biela et al. | 327/430 |
| 2012/0262220 A1* | 10/2012 | Springett | 327/430 |

FOREIGN PATENT DOCUMENTS

| JP | 2006-158185 A | 6/2006 |
|---|---|---|
| JP | 2006-158185 A | 6/2008 |
| JP | 2011-029386 A | 2/2011 |
| WO | WO 2010/108292 A2 | 9/2010 |

OTHER PUBLICATIONS

Extended European Search Report, dated Oct. 2, 2013, for European Application No. 12002997.0.
Aggeler, et al., "Controllable dv/dt Behaviour of the SIC MOSFET/JFET Cascode An Alternative Hard Commutated Switch for Telecom Applications", Applied Power Electronics Conference and Exposition, 2010, pp. 1584-1590.
Domes, et al., "CASCODE LIGHT-normally-on JFET stand alone performance in a normally-off Cascode circuit", Power Conversion/Intelligent Motion (PCIM) Europe 2010, 5 pages.

* cited by examiner

*Primary Examiner* — Allen Parker
*Assistant Examiner* — Gardner W Swan
(74) *Attorney, Agent, or Firm* — Birch, Stewart, Kolasch & Birch, LLP

(57) ABSTRACT

A semiconductor device including: an FET; a MOSFET having a drain thereof connected with a source of the FET; a resistor having one end thereof connected with a gate of the FET and having the other end thereof connected with a source of the MOSFET; and a diode having an anode thereof connected with the gate of the FET and having a cathode thereof connected with the source of the MOSFET.

4 Claims, 12 Drawing Sheets

FIG. 7

| ABSOLUTE MAXIMUM RATING | |
|---|---|
| DRAIN-SOURCE VOLTAGE | 600V |
| GATE-SOURCE VOLTAGE | -100V, 5V |
| DIRECT DRAIN CURRENT | 6.5A |

| ELECTRIC PROPERTIES | Min. | Typ. | Max. |
|---|---|---|---|
| GATE SCHOTTKY BARRIER DIODE FORWARD VOLTAGE | | 2V | 2.5V |
| GATE LEAKAGE CURRENT | 10uA | 100uA | |
| ZERO GATE VOLTAGE DRAIN CURRENT | | | 100uA |
| GATE THRESHOLD VOLTAGE | -5.0V | | -3.0V |
| DRAIN-SOURCE ON-RESISTANCE | | 100mΩ | 110mΩ |
| INPUT CAPACITANCE | | 300pF | |
| OUTPUT CAPACITANCE | | 40pF | |
| FEEDBACK CAPACITANCE | | 10pF | |
| RISE/FALL TIME | | 20ns | |
| TOTAL GATE CHARGE | | 2nC | 5nC |

FIG. 8

| ABSOLUTE MAXIMUM RATING | |
|---|---|
| DRAIN-SOURCE VOLTAGE | 30V |
| GATE-SOURCE VOLTAGE | 20V |
| DIRECT DRAIN CURRENT | 6.5A |

| ELECTRIC PROPERTIES | Min. | Typ. | Max. |
|---|---|---|---|
| GATE LEAKAGE CURRENT | | | 100nA |
| ZERO GATE VOLTAGE DRAIN CURRENT | | | 1uA |
| GATE THRESHOLD VOLTAGE | 1.0V | | 2.5V |
| DRAIN-SOURCE ON-RESISTANCE | | 30mΩ | 42mΩ |
| INPUT CAPACITANCE | | 430pF | |
| OUTPUT CAPACITANCE | | 155pF | |
| FEEDBACK CAPACITANCE | | 80pF | |
| RISE/FALL TIME | | 8ns | |
| TOTAL GATE CHARGE | | 6.1nC | 8.6nC |

FIG. 9 PRIOR ART

CASCODE CIRCUIT DEVICE WITH IMPROVED REVERSE RECOVERY CHARACTERISTIC

This Nonprovisional application claims priority under 35 U.S.C. §119 on Patent Application No. 2011-103529 filed in Japan on May 6, 2011, the entire contents of which are hereby incorporated by reference.

TECHNICAL FIELD

The present invention relates to a semiconductor device and an electronic device. Particularly, the present invention relates to a semiconductor device and an electronic device, each of which includes a normally-on type field-effect transistor.

BACKGROUND ART

A group III nitride semiconductor, whose typical examples are gallium nitride (GaN), AlGaN, InGaN, and the like, is advantageous as a material. As such, in a case where the group III nitride semiconductor is used as a power device, it is possible to anticipate good device properties such as high withstand voltage, high-speed operation, high heat-resistance, and low on-resistance. Because of this, in place of a conventional Si-material power device whose properties as a power device have come close to the limit, development of a power device in which the group III nitride semiconductor is utilized has been conducted.

Particularly, with regard to a field-effect transistor (FET), a transistor with a high electron mobility can be realized by causing a high-density two dimensional electron gas (2DEG) to be formed near a heterojunction interface between, for example, AlGaN and GaN. That is, it is possible to further reduce an on-resistance of the FET. There have been provided various device structures in which such a heterojunction interface is utilized.

Such a GaN FET is usually of a normally-on type which has a negative threshold voltage and, when a gate voltage is 0 V (zero volt), is brought into an on-state, in which a drain current flows.

In contrast, as to, for example, a metal-oxide semiconductor field-effect transistor (MOSFET) and an insulated gate bipolar transistor (IGBT), a normally-off type is the mainstream. A normally-off type transistor has a positive threshold voltage and, when a gate voltage is 0 V, is brought into an off-state, in which no drain current flows.

A normally-on type GaN FET has good properties such as high withstand voltage, high-speed operation, high heat-resistance, and low on-resistance. However, since it is necessary to supply a negative voltage to a gate in the normally-on type GaN FET, presence of a negative voltage supply source causes an increase in cost and an increase in circuit size in a case where the normally-on type GaN FET is used.

In order to use a GaN FET as a normally-off type FET, it is necessary to connect a normally-on type field-effect transistor with a normally-off type MOSFET by a connection technique called cascode connection. A power semiconductor device, in which a normally-off operation is achieved in this manner, has been well known. Since a MOSFET with low withstand voltage can be used as the normally-off type MOSFET, it is possible to minimize an increase in cost and a deterioration in property.

For example, Non-patent Literature 1 discloses a method of controlling, for the purpose of achieving EMC (electromagnetic compatibility), dv/dt in a cascode circuit in which a normally-on type SiC JFET (Junction Field-Effect Transistor) is cascode-connected with a MOSFET. Specifically, Cdg, M is added as illustrated in (a) of FIG. 9 or (i) Rd, (ii) Cdg, J, and (iii) Rgs are added as illustrated in (b) of FIG. 9, so that a time constant of a negative feedback at the time of a switching operation is changed. Thus dv/dt is controlled.

Note that Cdg, M in a circuit diagram illustrated in (a) of FIG. 9 and (i) Cdg, J and (ii) Rgs in a circuit diagram illustrated in (b) of FIG. 9 are variable because of an experiment for showing that dv/dt can be controlled by causing a capacitance or a resistance to change. Cdg, M, Cdg, J, and Rgs do not have to be variable. By determining, at the time of designing, the time constant of the negative feedback appropriately in accordance with a drain-gate capacitance or an internal gate resistance, a voltage change rate dv/dt which provides a good balance between (i) electric power efficiency which varies in accordance with switching loss and (ii) noise is achieved.

Non-patent Literature 2 discloses a cascode circuit in which a normally-on type SiC JFET is cascode-connected with a MOSFET. It is also disclosed that a reverse recovery current, which flows in a direction from a drain to a source when an electric current in a direction from the source toward the drain is shut off, is large in the cascode circuit. Non-patent Literature 2 further discloses a control method for preventing a large reverse current, as well as a control method which is employed in a circuit different from the cascode circuit.

Further, Patent Literature 1 discloses a semiconductor device which can achieve a normally-off operation and prevent an increase in manufacturing cost.

Still further, Patent Literature 2 discloses a power semiconductor device which reduces a switching loss caused by a reverse recovery current.

CITATION LIST

Patent Literature

Patent Literature 1
Japanese Patent Application Publication, Tokukai, No. 2011-29386 A (Publication Date: Feb. 10, 2011)
Patent Literature 2
Japanese Patent Application Publication, Tokukai, No. 2006-158185 A (Publication Date: Jun. 15, 2006)

Non-Patent Literature

Non-patent Literature 1
"Controllable dv/dt Behaviour of the SiC MOSFET/JFET Cascode An Alternative Hard Commutated Switch for Telecom Applications" Applied Power Electronics Conference and Exposition 2010
Non-patent Literature 2
"CASCODE LIGHT—normally-on JFET stand alone performance in a normally-off Cascode circuit" Power Conversion/Intelligent Motion (PCIM) Europe 2010

SUMMARY OF INVENTION

Technical Problem

However, in the configuration described in Non-patent Literature 2, it is necessary to supply a negative voltage so as to turn off the normally-on type JFET. A negative power source is therefore required, and a manufacturing cost is increased, accordingly.

In a case where a reverse recovery characteristic is improved in a cascode circuit in which a normally-on type SiC JFET is cascode-connected with a MOSFET as described in Non-patent Literature 2, EMC is deteriorated.

The following description will discuss measurement of a reverse recovery characteristic, with reference to FIG. 10.

(Experiment for Measuring Reverse Recovery Characteristic)

(Measuring Device 130)

FIG. 10 is a circuit diagram of a measuring device 130 for measuring (assessing) a reverse recovery characteristic of a subject 121 to be evaluated. The measuring device 130 includes a voltage source V130, a capacitor C130, an ammeter I130, a coil L130, a signal generator OS130, and a device FET 125.

The subject 121 to be evaluated is a conventional semiconductor device 121' (that is, a composite element) illustrated in FIG. 11 and includes a normally-on type FET 123, a normally-off type MOSFET 124, and a resistor R121.

The normally-on type FET 123 and the normally-off type MOSFET 124 are cascode-connected with each other via the resistor R121.

Note that a gate of the normally-off type MOSFET 124 will be referred to as a gate of the semiconductor device 121'. Likewise, a source of the normally-off type MOSFET 124 will be referred to as a source of the semiconductor device 121'. A drain of the normally-on type FET 123 will be referred to as a drain of the semiconductor device 121'.

In the subject 121 to be evaluated (i.e., the semiconductor device 121'), the gate of the MOSFET 124 and the source of the MOSFET 124 are short-circuited. In this case, the source of the MOSFET 124 functions as an anode of a diode and a drain of the MOSFET 124 functions as a cathode of the diode. Accordingly, the MOSFET 124 exhibits diode characteristics. The subject 121 to be evaluated also exhibits diode characteristics because of a cascode connection. The circuit illustrated in FIG. 10 is a circuit for measuring a reverse recovery characteristic of the subject 121 to be evaluated.

In the measuring device 130 illustrated in FIG. 10, an output (+) of the voltage source V130 is connected with each of one end of the capacitor C130, an output of the ammeter I130, and one end of the coil L130. The other end of coil L130, one end of the resistor R121, the source of the MOSFET 124, the gate of the MOSFET 124, and a drain of the device FET 125 are connected with one another.

The other end of the resistor R121 is connected with a gate of the FET 123. A source of the FET 123 is connected with the drain of the MOSFET 124. The drain of the FET 123 is connected with an input of the ammeter I130.

An input (−) of the voltage source V130, the other end of the capacitor C130, and a source of the device FET 125 are electrically grounded.

(Measurement of Reverse Recovery Characteristic)

The following description will discuss measurement of a reverse recovery characteristic carried out by use of the circuit illustrated in FIG. 10.

First, in a measuring circuit illustrated in FIG. 10, a high level signal is supplied from the signal generator OS130 to a gate of the device FET 125 so as to turn on the device FET 125. This causes a power supply voltage (an output voltage of the voltage source V130) to cause an electric current to flow through the coil L130. Meanwhile, the subject 121 to be evaluated is in an off-state. That is, both of two FETs in the subject 121 to be evaluated are in an off-state.

In a case where the device FET 125 is turned off in a state in which the electric current flows through the coil L130, an electric potential of the drain of the device FET 125 (i.e., an electric potential of the source of the semiconductor device 121') increases.

When the electric potential of the source of the semiconductor device 121' becomes substantially equal to the power supply voltage, the normally-on type FET 123 conducts. Note that the normally-off type MOSFET 124 is still off in this state.

When the electric potential of the source of the semiconductor device 121' increases to about a voltage equal to a sum of (i) a forward voltage of a body diode of the normally-off type MOSFET 124 and (ii) the power supply voltage, the body diode is turned on, so that the subject 121 to be evaluated is turned on. In response to the subject 121 to be evaluated being turned on, an electric current is regenerated, so that the electric potential of the source of the semiconductor device 121' stops increasing. A flow of a regenerated current which is regenerated when the subject 121 to be evaluated is turned on takes the following route: the one end of the coil L130→the other end of the coil L130→the source of the MOSFET 124→the drain of the MOSFET 124→the source of the FET 123→the drain of the FET 123→the ammeter I130.

This is an early stage of the measurement of the reverse recovery characteristic.

In order to measure the reverse recovery characteristic, the device FET 125 is turned on again in a state in which the regenerated current flows. This causes a sharp decrease in the regenerated current flowing in the subject 121 to be evaluated. A rate of decrease of the regenerated current is di/dt.

When the regenerated current becomes zero, an electric current that is reverse to the regenerated current (i.e., a reverse recovery current) flows. A flow of the reverse recovery current takes the following route: the ammeter I130→the drain of the FET 123→the source of the FET 123→the drain of the MOSFET 124→the source of the MOSFET 124→the drain of the device FET 125→the source of the device FET 125→the ground (GND).

At the same time as the body diode of the MOSFET 124 is turned off (i.e., recovers), the electric potential of the drain of the device FET 125 (i.e., the electric potential of the source of the semiconductor device 121') starts to decrease. Decrease in electric potential of the source of the semiconductor device 121' causes the body diode of the MOSFET 124 to be turned off. This causes an increase in drain-source voltage of the MOSFET 124.

When a gate-source voltage of the FET 123 exceeds a negative threshold voltage and approaches 0 V, the FET 123 is turned off.

The electric potential of the drain of the device FET 125 (i.e., the electric potential of the source of the semiconductor device 121') decreases to a ground voltage. To be exact, the electric potential of the drain of the device FET 125 (i.e., the electric potential of the source of the semiconductor device 121') decreases to an on-voltage of the device FET 125.

In this manner, it is possible to observe the reverse recovery current from a time when the subject 121 to be evaluated is in an on-state until the subject 121 to be evaluated is turned off. That is, it is possible to measure the reverse recovery characteristic of the subject 121 to be evaluated.

(Electric Current Flowing After Regeneration)

The following description will additionally discuss an electric current that flows after the regeneration occurs. In a case where the device FET 125 is turned on in a state in which the regenerated current flows, an electric current that flows through the coil L130 changes from (i) the regenerated current to (ii) a device FET current, which flows through the device FET 125. Note that, in a case where diodes in the circuit illustrated in FIG. 10 are ideal diodes, the regenerated current remains zero after it becomes zero.

Immediately after the electric current changes, that is, immediately after the regenerated current becomes zero, an electric current flows from the drain of the MOSFET 124 to the source of the MOSFET 124. This is because the body diode of the MOSFET 124 has not recovered (has not been turned off) yet.

While the electric current that flows through the coil L130 changes from the regenerated current to the device FET current, the FET 123 remains in an on-state.

When the body diode of the MOSFET 124 is turned off, a charging current flows into an output capacitance (drain-source parasitic capacitance) of the MOSFET 124. Meanwhile, the FET 123 remains in the on-state.

Now, the following description will discuss a case in which an internal gate resistance of the MOSFET 124 is small. When the drain-source voltage of the MOSFET 124 exceeds an absolute value of the threshold voltage of the FET 123 (since the FET 123 is of a normally-on type, the threshold voltage is a negative voltage), the FET 123 is turned off, so that a charging current flows. When charging is finished, that is, when the electric potential of the drain of the device FET 125 decreases to a ground potential, the charging current becomes zero.

In contrast, the following description will discuss a case in which the internal gate resistance of the MOSFET 124 is large. As the drain-source voltage of the MOSFET 124 increases, an absolute value of the gate-source voltage (negative voltage) of the FET 123 decreases (approaches 0 V) with a delay caused in accordance with a time constant determined based on the internal gate resistance and an input capacitance of the FET 123. Due to the delay, the drain-source voltage of the MOSFET 124 exceeds a breakdown voltage before the absolute value of the gate-source voltage of the FET 123 becomes not more than a threshold. As a result, a breakdown current, which is a current different from the charging current, flows through the MOSFET 124.

When the absolute value (negative voltage) of the gate-source voltage of the FET 123 becomes equal to or lower than the threshold, the FET 123 turns off, so that a charging current flows. When the charging is finished, that is, when the electric potential of the drain of the device FET 125 decreases to the ground potential, the charging current becomes zero.

The electric current which starts flowing after the regenerated current becomes zero and keeps flowing until the charging is finished is the reverse recovery current.

It is difficult to make a clear distinction between the reverse recovery current and the charging current. The charging current is included in the scope of the reverse recovery current.

Problem of Conventional Invention

The following description will summarize problems of the conventional invention. As early described, the invention in accordance with Non-patent Literature 2 has a problem that the manufacturing cost increases due to addition of the negative power source.

Next, Non-patent Literature 1 describes that a semiconductor device configured by use of cascode connection has a poor reverse recovery characteristic. In order to merely improve the reverse recovery characteristic, it is only necessary that a resistance of the resistor R121 be reduced in the subject 121 to be evaluated illustrated in FIG. 10 so that the subject 121 to be evaluated is turned off quickly. However, as the resistance of the resistor R121 is reduced, the turning on of the subject 121 to be evaluated also becomes faster. This deteriorates EMC as described in Non-patent Literature 1.

FIG. 12 is a waveform chart showing that a reduction in resistance of the resistor R121 causes a reduction in reverse recovery current and, ultimately, causes a reduction in reverse recovery time. (a) of FIG. 12 is a waveform chart corresponding to a case in which the resistor R121 has a resistance of 10Ω. (b) of FIG. 12 is a waveform chart corresponding to a case in which the resistor R121 has a resistance of 0Ω (zero ohm). As is clear from (a) and (b) of FIG. 12, a reverse recovery current Ir decreases as the resistance of the resistor R121 is reduced. Reverse recovery time tr also decreases as the resistance is decreased.

Lastly, both of the invention in accordance with Patent Literature 1 and the invention in accordance with Patent Literature 2 have a semiconductor device configured by use of cascode connection. As such, like the invention in accordance with Non-patent Literature 1, there is a trade-off relationship between a reverse recovery characteristic and EMC.

As describe above, a conventional semiconductor device (e.g., the subject 121 to be evaluated) including a semiconductor device configure by use of cascode connection has either (i) an increase in manufacturing cost due to a negative power source or (ii) a trade-off relationship between a reverse recovery characteristic and EMC.

The present invention is accomplished in view of the conventional problem. An object of the present invention is to provide a semiconductor device and an electronic device, each of which can achieve a good reverse recovery characteristic and good EMC at the same time and is less expensive than a conventional semiconductor device.

Solution to Problem

In order to achieve the object, a semiconductor device of the present invention is a semiconductor device including: a first field-effect transistor being of a normally-on type; a second field-effect transistor being of a normally-off type and having a drain electrode thereof connected with a source electrode of the first field-effect transistor; a resistor having one end thereof connected with a gate of the first field-effect transistor and having the other end thereof connected with a source of the second field-effect transistor; and a diode having an anode thereof connected with the gate of the first field-effect transistor and having a cathode thereof connected with the source of the second field-effect transistor.

According to the invention, the semiconductor device includes the diode. As such, in the two field-effect transistors (the first field-effect transistor and the second field-effect transistor) cascode-connected with each other, a gate drive current flows through the diode in priority to the resistor when an electric current flowing through the second field-effect transistor is turned off.

The gate drive current flows in (i) the following route: the drain of the first field-effect transistor→a drain-gate parasitic capacitance of the first field-effect transistor→the gate of the first field-effect transistor→the diode→the source of the second field-effect transistor and (ii) the following route: the source of the first field-effect transistor→a gate-source parasitic capacitance of the first field-effect transistor→the gate of the first field-effect transistor→the diode→the source of the second field-effect transistor.

This allows the semiconductor device to be turned off more speedily than a conventional semiconductor device. That is, switching speed of the semiconductor device increases.

Accordingly, time in which the reverse recovery current flows in the semiconductor device is shorter than that in the conventional semiconductor device. As a result, it becomes possible to achieve a good reverse recovery characteristic.

Since the semiconductor device includes the diode, it is not necessary to reduce, for the purpose of improving the reverse recovery characteristic, a resistance of the resistor connected in parallel with the diode. That is, it is only necessary that the resistance of the resistor be set to a value that is large enough to achieve good EMC (Electromagnetic Compatibility) (that is, not so large as to increase switching loss too much). This makes it possible to achieve good EMC and reduce the switching loss in the semiconductor device.

Further, unlike the conventional semiconductor device, there is no need of providing a negative power source (a voltage source for supplying a negative voltage) in order to cause the first field-effect transistor of a normally-on type to operate. This makes the semiconductor device less expensive than the conventional semiconductor device.

Therefore, it is possible to provide a semiconductor device which can achieve a good reverse recovery characteristic and good EMC at the same time and is less expensive than the conventional semiconductor device.

In order to achieve the object, a semiconductor device of the present invention is a semiconductor device including: a first field-effect transistor being of a normally-on type; a second field-effect transistor being of a normally-off type and having a drain thereof connected with a source of the first field-effect transistor; a resistor having one end thereof connected with a gate of the first field-effect transistor and having the other end thereof connected with a source of the second field-effect transistor; a diode having an anode thereof connected with the gate of the first field-effect transistor; and a capacitor having one end thereof connected with a drain of the first field-effect transistor and having the other end thereof connected with a cathode of the diode.

According to the invention, the semiconductor device includes the diode and the capacitor. As such, in the two field-effect transistors (the first field-effect transistor and the second field-effect transistor) cascode-connected with each other, part of a gate drive current flows through the diode, the capacitor, and the resistor when an electric current flowing through the semiconductor device is turned off.

The gate drive current flows in the following route: a parasitic capacitance of the diode→the capacitor→the resistor→the source of the second field-effect transistor.

This allows the semiconductor device to be turned off more speedily than a conventional semiconductor device. That is, switching speed of the semiconductor device increases.

Therefore, time during which a reverse recovery current flows in the semiconductor device is shorter than that in the conventional semiconductor device. Consequently, it becomes possible to achieve a good reverse recovery characteristic.

Since the semiconductor device includes the diode and the capacitor so as to cause the gate drive current to flow, it becomes unnecessary to increase, for the purpose of achieving good EMC, a capacitance of the capacitor. This makes it possible to achieve good EMC and reduce the switching loss in the semiconductor device.

Further, unlike the conventional semiconductor device, there is no need of providing a negative power source (a voltage source for supplying a negative voltage) in order to cause the first field-effect transistor of a normally-on type to operate. This makes the semiconductor device less expensive than the conventional semiconductor device.

Therefore, it is possible to provide a semiconductor device which can achieve a good reverse recovery characteristic and good EMC at the same time and is less expensive than the conventional semiconductor device.

An electronic device of the present invention includes the semiconductor device. Therefore, the electronic device of the present invention (i) can achieve a good reverse recovery characteristic and good EMC at the same time and (ii) is less expensive than a case in which a conventional semiconductor device is used.

Advantageous Effects of Invention

As described above, a semiconductor device of the present invention is a semiconductor device including: a first field-effect transistor; a second field-effect transistor having a drain thereof connected with a source of the first field-effect transistor; a resistor having one end thereof connected with a gate of the first field-effect transistor and having the other end thereof connected with a source of the second field-effect transistor; and a diode having an anode thereof connected with the gate of the first field-effect transistor and having a cathode thereof connected with the source of the second field-effect transistor.

As described above, a semiconductor device of the present invention is a semiconductor device including: a first field-effect transistor; a second field-effect transistor having a drain thereof connected with a source of the first field-effect transistor; a resistor having one end thereof connected with a gate of the first field-effect transistor and having the other end thereof connected with a source of the second field-effect transistor; a diode having an anode thereof connected with the gate of the first field-effect transistor; and a capacitor having one end thereof connected with a drain of the first field-effect transistor and having the other end thereof connected with a cathode of the diode.

Therefore, it is possible to provide a semiconductor device which can achieve a good reverse recovery characteristic and good EMC at the same time and is less expensive than the conventional semiconductor device.

BRIEF DESCRIPTION OF DRAWINGS

FIG. 7 is a view showing an example of a specification of a normally-on type FET.

FIG. 8 is a view showing an example of a specification of a normally-off type MOSFET.

DESCRIPTION OF EMBODIMENTS

An embodiment of the present invention will be described below with reference to FIGS. 1, 2, and 5 through 8.

First Embodiment (Configuration of Semiconductor Device 1)

Figure 1:
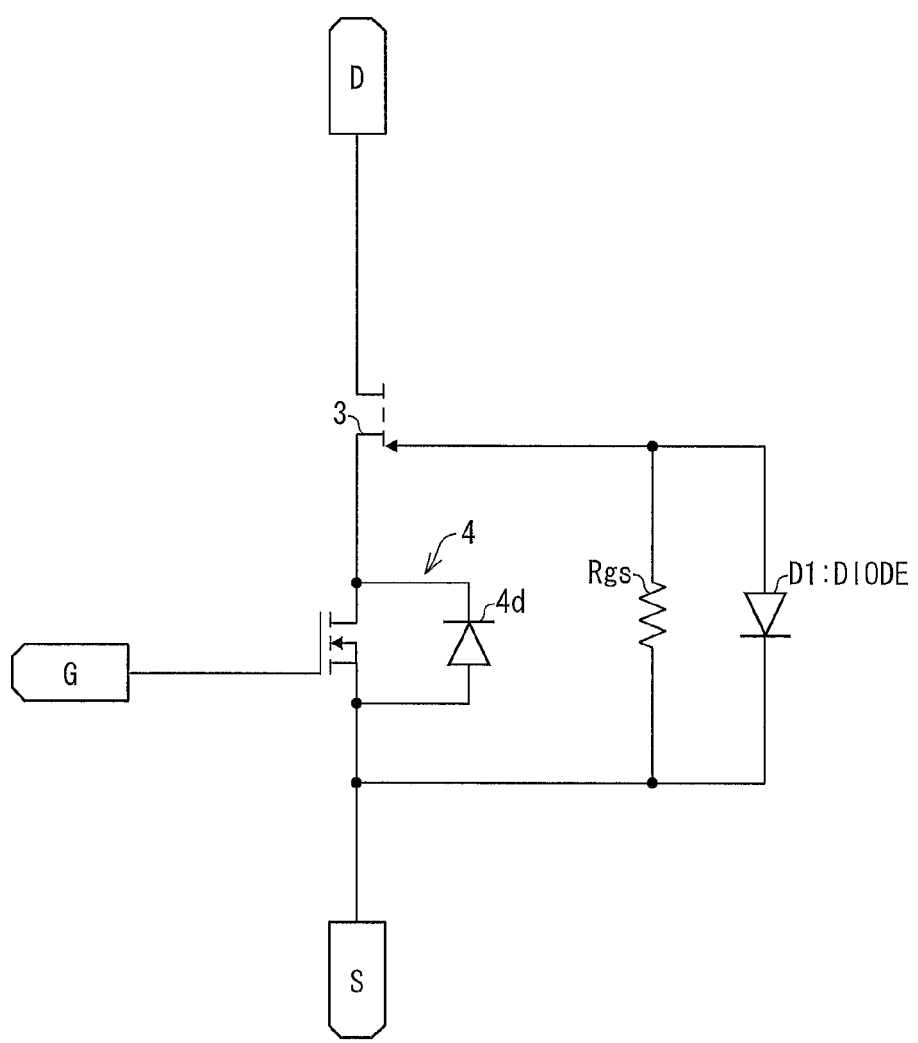
FIG. 1 is a circuit diagram of a semiconductor device in accordance with an embodiment of the present invention.

FIG. 1 is a circuit diagram of a semiconductor device 1 in accordance with the present embodiment. The semiconductor device 1 (i.e., a composite element) includes a normally-on type FET 3 (first field-effect transistor), a normally-off type MOSFET 4 (second field-effect transistor), a resistor Rgs, and a diode D1.

The normally-on type FET 3 and the normally-off type MOSFET 4 are cascode-connected with each other. The normally-off type MOSFET 4 has a body diode 4*d*.

The FET 3 contains a group III nitride semiconductor (compound semiconductor), whose typical examples are gallium nitride (GaN), AlGaN, InGaN, and the like. This allows the FET 3 to be a normally-on type field-effect transistor and also allows high resistance to pressure, high-speed operation, high heat-resistance, and low on-resistance to be achieved in the FET 3.

Note that a gate of the MOSFET 4 will be referred to as a gate of the semiconductor device 1 (G in FIG. 1). Likewise, a source of the MOSFET 4 will be referred to as a source of the semiconductor device 1 (S in FIG. 1). A drain of the FET 3 will be referred to as a drain of the semiconductor device 1D in (FIG. 1).

In the semiconductor device 1 illustrated in FIG. 1, the source of the MOSFET 4, an anode of the body diode 4*d*, one end of the resistor Rgs, and a cathode of the diode D1 are connected with one another.

A drain of the MOSFET 4, a cathode of the body diode 4*d*, and a source of the FET 3 are connected with one another.

The other end of the resistor Rgs, an anode of the diode D1, and a gate of the FET 3 are connected with one another.

(Operation of Semiconductor Device 1)

In the semiconductor device 1 illustrated in FIG. 1, good EMC (electromagnetic compatibility) is achieved by reducing a voltage change rate dv/dt (later described) when the semiconductor device 1 is turned on. When the semiconductor device 1 is turned off, a good reverse recovery characteristic is achieved by speedily turning off the semiconductor device 1 by means of the diode D1.

Figure 5:
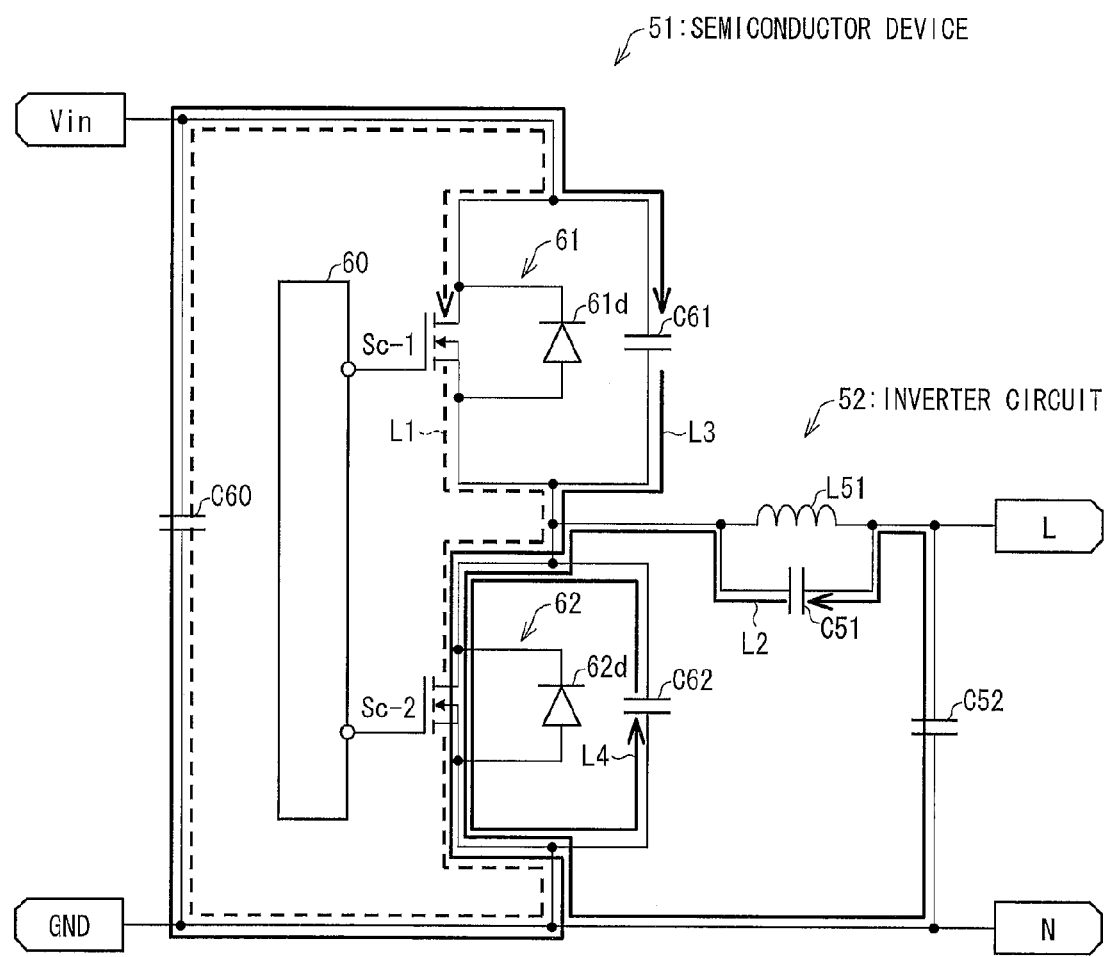
FIG. 5 is a circuit diagram illustrating noise generated in a case where a semiconductor device configured by use of cascode connection is used.

Initially, with regard to achievement of good EMC by reducing the voltage change rate dv/dt, the following description will discuss, with reference to FIG. 5, noise generated in a case where a semiconductor device configured by use of cascode connection is used.

(Relation Between Voltage Change Rate dv/dt and Noise)

FIG. 5 is a circuit diagram for describing noise generated in a case of using a semiconductor device configured by use of cascode connection.

The circuit illustrated in FIG. 5 includes a semiconductor device 51 and an inverter circuit 52.

The semiconductor device 51 includes a high-side FET 61, a low-side FET 62, an oscillation circuit 60, and a capacitor C60. A capacitance C61 and a capacitance C62 are each a parasitic capacitance and will be later described. The high-side FET 61 has a body diode 61*d*, and the low-side FET 62 has a body diode 62*d*. The inverter circuit 52 includes a coil L51 and a capacitor C52.

A capacitance C51 is a parasitic capacitance and will be later described.

In the circuit illustrated in FIG. 5, an input voltage Vin is applied to one end of the capacitor C60, a drain of the high-side FET 61, a cathode of the body diode 61*d*, and one end of the capacitance C61.

A control signal Sc-1 is supplied from the oscillation circuit 60 to a gate of the high-side FET 61. The high-side FET 61 is turned on or off in accordance with the control signal Sc-1. A control signal Sc-2 is supplied from the oscillation circuit 60 to a gate of the low-side FET 62. The low-side FET 62 is turned on or off in accordance with the control signal Sc-2.

A source of the high-side FET 61, an anode of the body diode 61*d*, the other end of the capacitance C61, a drain of the low-side FET 62, a cathode of body diode 62*d*, one end of the capacitance C62, one end of the coil L51, and one end of the capacitance C51 are connected with one another.

Each of the other end of the coil L51 and the other end of the capacitance C51 is connected with one end of the capacitor C52.

The other end of the capacitor C60, a source of the low-side FET 62, an anode of the body diode 62*d*, the other end of the capacitance C62, and the other end of the capacitor C52 are electrically grounded.

Now, the following description will discuss a state in which the control signal Sc-2 has caused the low-side FET 62 to be turned off and a freewheel current flows through the body diode 61*d* of the high-side FET 61 in the circuit illustrated in FIG. 5.

In this state, the capacitance C61 is present parasitically at the high-side FET 61. Likewise, the capacitance C62 is present parasitically at the low-side FET 62 and the capacitance C51 is present parasitically at the coil L51.

In a case where the low-side FET 62 is turned on in this state by means of the control signal Sc-2, a reverse recovery current of the high-side FET 61 flows in a route indicated by the broken line L1 with an arrow in the FIG. 5.

A maximum value of the reverse recovery current of the high-side FET 61 depends on a rate of change di/dt of an electric current which was flowing until right before the reverse recovery current flows. In general, the maximum value increases as the rate of change di/dt increases.

When the body diode 61*d* of the high-side FET 61 is turned off, charging or discharging is carried out at each of the parasitic capacitances (the capacitances C51, C61, and C62) connected with the drain of the low-side FET 62. A path of a charging current of and a discharge current of the capacitance C51 is indicated by the solid line L2 with an arrow. A path of a charging current of the capacitance C61 is indicated by the solid line L3 with an arrow. A path of the discharge current of the capacitance C62 is indicated by the solid line L4 with an arrow. A magnitude of each of the currents (discharge current or charging current) is in proportion to a rate of change dv/dt of the input voltage Vin.

In the circuit illustrated in FIG. 5, an inductance is present parasitically at a path of an electric current. A change in electric current in a parasitic inductance causes a change in electric potential of a node provided on the path or causes a change in magnetic field around the path. A change in electric potential of the node becomes a source of conductive noise at a terminal to which the input voltage Vin is supplied. A change in magnetic field around the path becomes a source of radiation noise which is radiated into space.

Therefore, in order to achieve good EMC by reducing noise, it is effective to reduce (i) a change in reverse recovery current and (ii) a change in charging current and a change in discharge current.

In order to reduce the change in reverse recovery current, it is effective to reduce (i) the rate of change di/dt of the charging current and the rate of change di/dt of the discharge current or (ii) dependency on the rate of change di/dt of the charging current and dependency on the rate of change di/dt of the discharge current. In order to reduce the change in charging current and the change in discharge current (i.e., the rate of change di/dt of the charging current and the rate of change di/dt of the discharge current), it is only necessary to reduce $d^2v/dt^2$. In order to reduce $d^2v/dt^2$, it is effective to reduce dv/dt.

In general, in a case where a design is made so as to reduce dv/dt at a time when one of two FETs is turned on, di/dt of a diode connected with the other of the two FETs (a body diode of the other FET) also becomes small.

As described above, in order to achieve good EMC by reducing noise generated in a case of using a semiconductor device configured by use of cascode connection, it is only necessary to reduce a voltage change rate dv/dt. However, an excessive reduction in voltage change rate dv/dt causes an increase in switching loss. Therefore, it is necessary to set an optimum dv/dt (well-balanced dv/dt) by taking EMC and switching loss into consideration.

Figure 2:
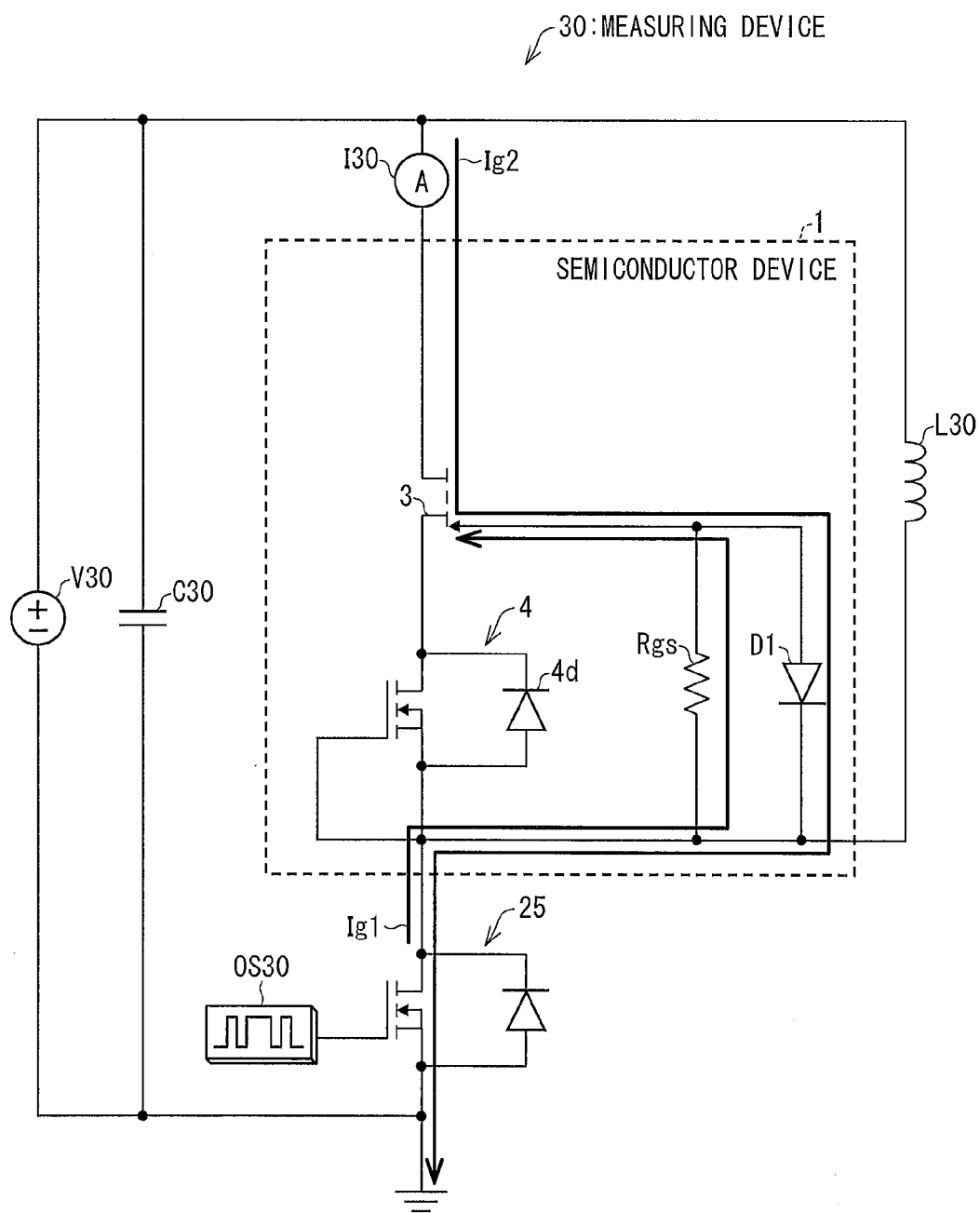
FIG. 2 is a circuit diagram of a measuring circuit for measuring a reverse recovery characteristic of a semiconductor device in accordance with an embodiment of the present invention.

The following description will discuss, with reference to FIG. 2, measurement of a reverse recovery characteristic of the semiconductor device 1 in accordance with the present embodiment.

(Experiment for Measuring Reverse Recovery Characteristic)

(Measuring Device 30)

FIG. 2 is a circuit diagram of a measuring device 30 for measuring a reverse recovery characteristic of the semiconductor device 1 in accordance with the present embodiment. The measuring device 30 includes a voltage source V30, a capacitor C30, an ammeter I30, a coil L30, a signal generator OS30, and a device FET 25.

In the semiconductor device 1, the gate of the MOSFET 4 and the source of the MOSFET 4 are short-circuited. In this case, the source of the MOSFET 4 functions as an anode of a diode and the drain of the MOSFET 4 functions as a cathode of the diode. Accordingly, the MOSFET 4 exhibits diode characteristics. The circuit illustrated in FIG. 2 is a circuit for measuring a reverse recovery characteristic of the diode constituted by the MOSFET 4.

In the measuring circuit 30 illustrated in FIG. 2, an output (+) of the voltage source V30 is connected with one end of the capacitor C30, an output of the ammeter I30, and one end of the coil L30. The other end of the coil L30, the one end of the resistor Rgs, the cathode of the diode D1, the source of the MOSFET 4, the anode of the body diode 4d, the gate of the MOSFET 4, and a drain of the device FET 25 are connected with one another.

The other end of the resistor Rgs is connected with the anode of the diode D1 and the gate of the FET 3. The source of the FET 3 is connected with the drain of the MOSFET 4 and the cathode of the body diode 4d. The drain of the FET 3 is connected with an input of the ammeter I30.

An input (−) of the voltage source V30, the other end of the capacitor C30, and a source of the device FET 25 are electrically grounded.

(Measurement of Reverse Recovery Characteristic)

The following description will discuss measurement of a reverse recovery characteristic by use of the circuit illustrated in FIG. 2.

First, in the measuring circuit illustrated in FIG. 2, a high level signal is supplied from the signal generator OS30 to a gate of the device FET 25, so that the device FET 25 is turned on. This causes a power supply voltage (an output voltage of the voltage source V30) to cause an electric current to flow through the coil L30. Meanwhile, the semiconductor device 1 is in an off-state. That is, both of two FETs in the semiconductor device 1 are in an off-state.

In a case where the device FET 25 is turned off in a state in which the electric current flows through the coil L30, an electric potential of the drain of the device FET 25 (i.e., an electric potential of the source of the semiconductor device 1) increases.

When the electric potential of the source of the semiconductor device 1 becomes substantially equal to the power supply voltage, the normally-on type FET 3 conducts. When the FET 3 conducts, a gate drive current Ig 1 flows in the following route: the source of the semiconductor device 1→the resistor Rgs→the gate of the FET 3. Note that the normally-off type MOSFET 4 is still off in this state.

When the electric potential of the source of the semiconductor device 1 increases to about a voltage equal to a sum of (i) a forward voltage of the body diode 4d of the normally-off type MOSFET 4 and (ii) the power supply voltage, the body diode 4d is turned on, so that the semiconductor device 1 is turned on. In response to the semiconductor device 1 being turned on, an electric current is regenerated, so that the electric potential of the source of the semiconductor device 1 stops increasing. A flow of a regenerated current which is regenerated when the semiconductor device 1 is turned on takes the following route: the one end of the coil L30→the other end of the coil L30→the source of the MOSFET 4→the drain of the MOSFET 4→the source of the FET 3→the drain of the FET 3→the ammeter I30.

This is an early stage of the measurement of the reverse recovery characteristic.

In order to measure the reverse recovery characteristic, the device FET 25 is turned on again in a state in which the regenerated current flows. This causes a sharp decrease in the regenerated current flowing in the semiconductor device 1. A rate of decrease of the regenerated current is di/dt.

When the regenerated current becomes zero, an electric current that is reverse to the regenerated current (i.e., a reverse recovery current (Ir in FIG. 6)) flows. A flow of the reverse recovery current takes the following route: the ammeter I30→the drain of the FET 3→the source of the FET 3→the drain of the MOSFET 4→the source of the MOSFET 4→the drain of the device FET 25→the source of the device FET 25→the ground (GND).

Since the semiconductor device 1 includes the diode D1, a gate drive current Ig2 flows at the same time as the body diode 4d of the MOSFET 4 is turned off. A flow of the gate drive current Ig2 takes the following route: the ammeter I30→the drain of the FET 3→the gate of the FET 3→the drain D1→the drain of the device FET 25→the source of the device FET 25→the ground (GND). When a gate-source voltage of the FET 3 becomes not more than a threshold due to the gate drive current Ig2, the FET 3 is turned off and the reverse recovery current becomes zero.

As described above, the gate drive current Ig2 flows via the diode D1 in the semiconductor device 1. Because of this, a decrease in electric potential of the drain of the device FET 25 (i.e., electric potential of the source of the semiconductor device 1) occurs early as compared with a conventional semiconductor device. Accordingly, the semiconductor device 1 in accordance with the present embodiment is turned off more speedily than the conventional semiconductor device. That is, the semiconductor device 1 in accordance with the present embodiment achieves a reverse recovery characteristic better than that of the conventional semiconductor device.

In addition, since the semiconductor device 1 includes the diode D1, it is not necessary to reduce, for the purpose of improving the reverse recovery characteristic, a resistance of the resistor Rgs connected in parallel with the diode D1. That is, it is only necessary that the resistance of the resistor Rgs be set to a value that is large enough to achieve good EMC (and not so large as to increase switching loss too much). This makes it possible to achieve good EMC and reduce the switching loss in the semiconductor device 1.

Further, unlike the conventional semiconductor device, there is no need of providing a negative power source (a voltage source for supplying a negative voltage) in order to cause the normally-on type FET 3 to operate. This makes the semiconductor device 1 less expensive than the conventional semiconductor device.

Therefore, it is possible to provide the semiconductor device 1 which can achieve a good reverse recovery characteristic and good EMC at the same time and is less expensive than the conventional semiconductor device.

(Diode D1)

The diode D1 in accordance with the present embodiment can normally be a PN-junction diode (a diode obtained by joining a P-type semiconductor and a N-type semiconductor to each other).

Alternatively, the diode D1 can be a Schottky junction diode obtained by joining a source electrode of the MOSFET 4 with a semiconductor (e.g., a P-type semiconductor or an N-type semiconductor).

In the Schottky junction diode, a conductor (the source electrode of the MOSFET 4) is provided in place of one of the semiconductors in the PN-junction diode. This allows the number of components to be reduced and, accordingly, allows an implementation cost to be reduced.

In addition, a diode D1 provided as the Schottky junction diode is turned on in less time than that required to turn on a diode D1 provided as the PN-junction diode. This makes it possible to cause the gate drive current Ig2 to flow sooner so as to turn off the semiconductor device 1 speedily.

(Reverse Recovery Current and Reverse Recovery Time)

Figure 6:
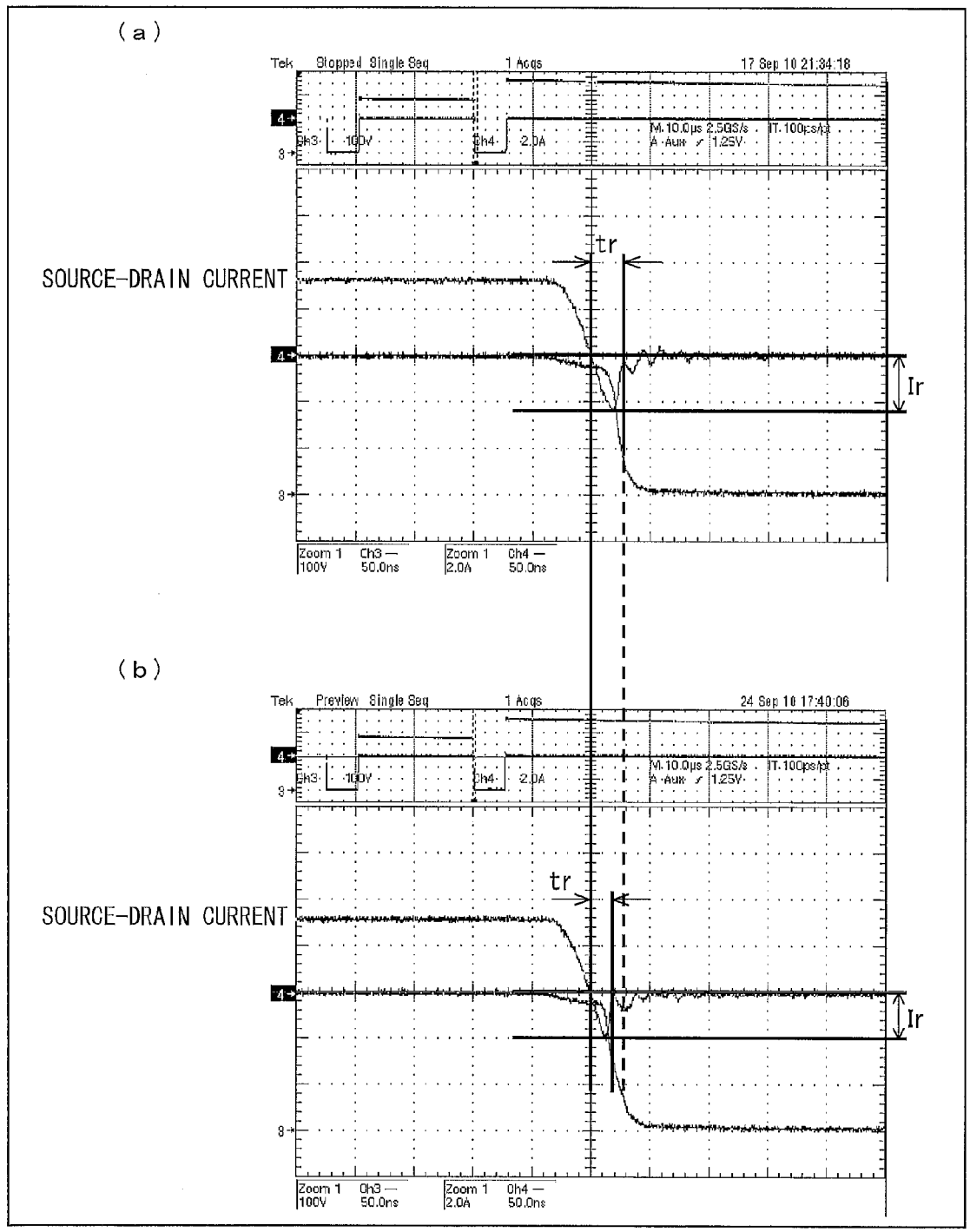
FIG. 6 is a waveform chart showing that a semiconductor device in accordance with an embodiment of the present invention has a reverse recovery current and reverse recovery time which are reduced as compared with those of a conventional semiconductor device. (a) of FIG. 6 is a waveform chart of a conventional semiconductor device, and (b) of FIG. 6 a waveform chart of a semiconductor device in accordance with an embodiment of the present invention.
Figure 9:
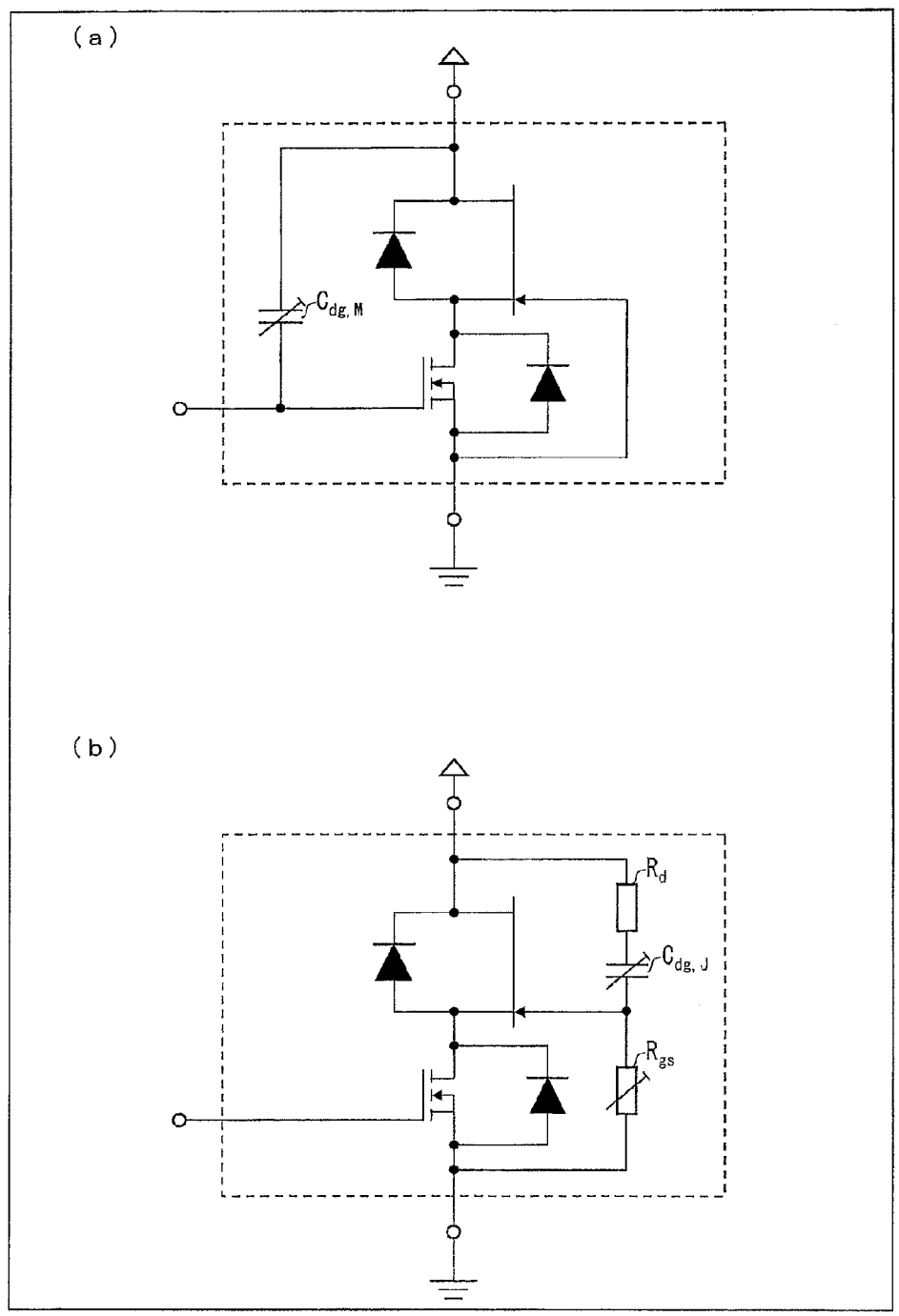
FIG. 9 is a view corresponding to FIG. 2 of Non-patent Literature 1. (a) of FIG. 9 is a circuit diagram for describing that dv/dt is controlled by adding Cdg, M so as to change a time constant of a negative feedback at the time of switching operation. (b) of FIG. 9 is a circuit diagram for describing that dv/dt is controlled by adding (i) Rd, (ii) Cdg, J, and (iii) Rgs so as to change a time constant of a negative feedback at the time of switching operation.
Figure 10:
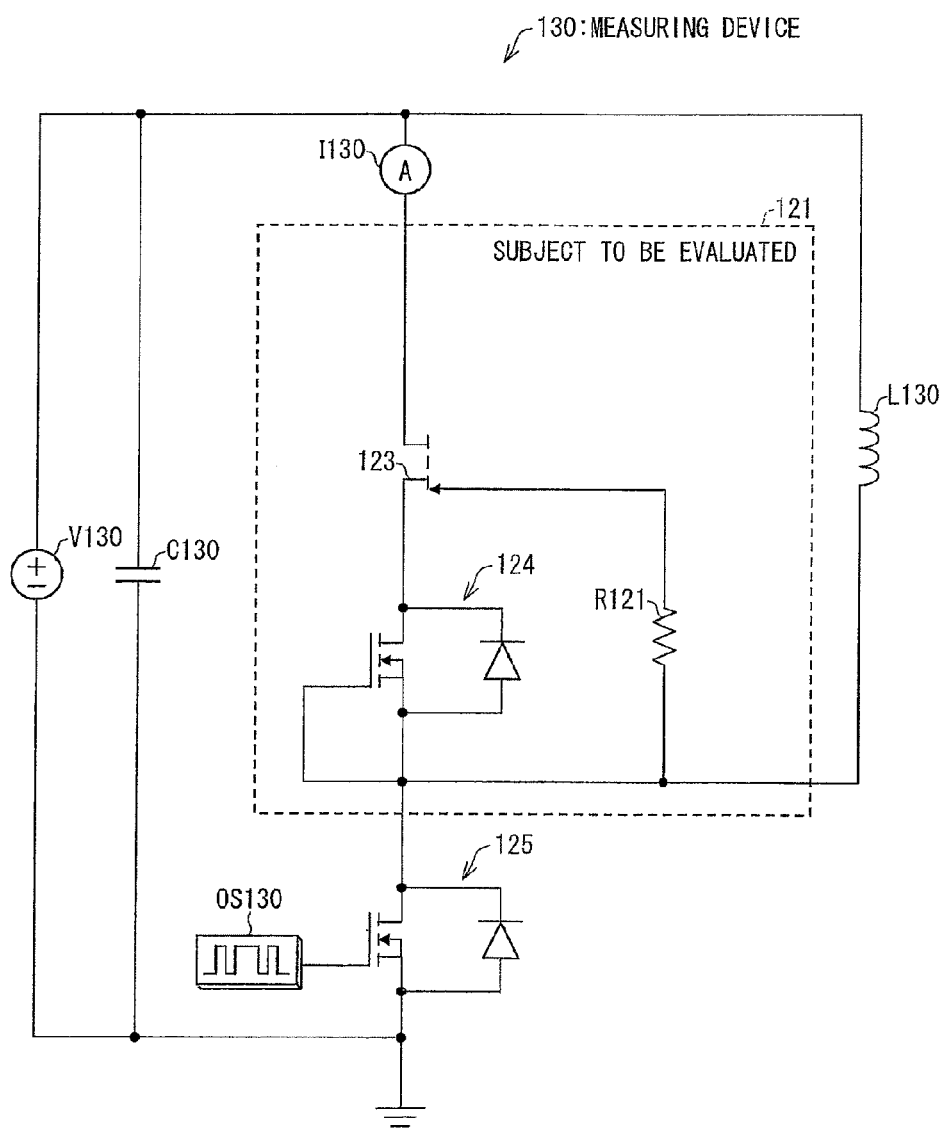
FIG. 10 is a circuit diagram for measuring a reverse recovery characteristic of a subject to be evaluated.
Figure 11:
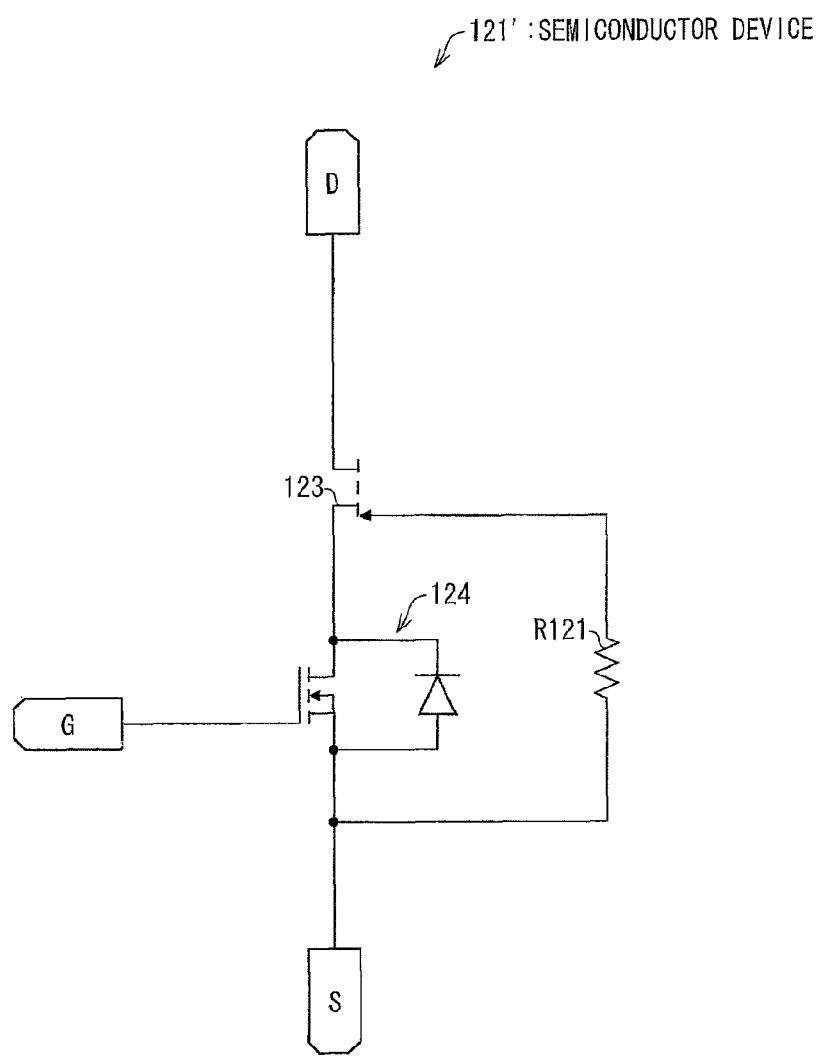
FIG. 11 is a circuit diagram of a conventional semiconductor device to be evaluated.
Figure 12:
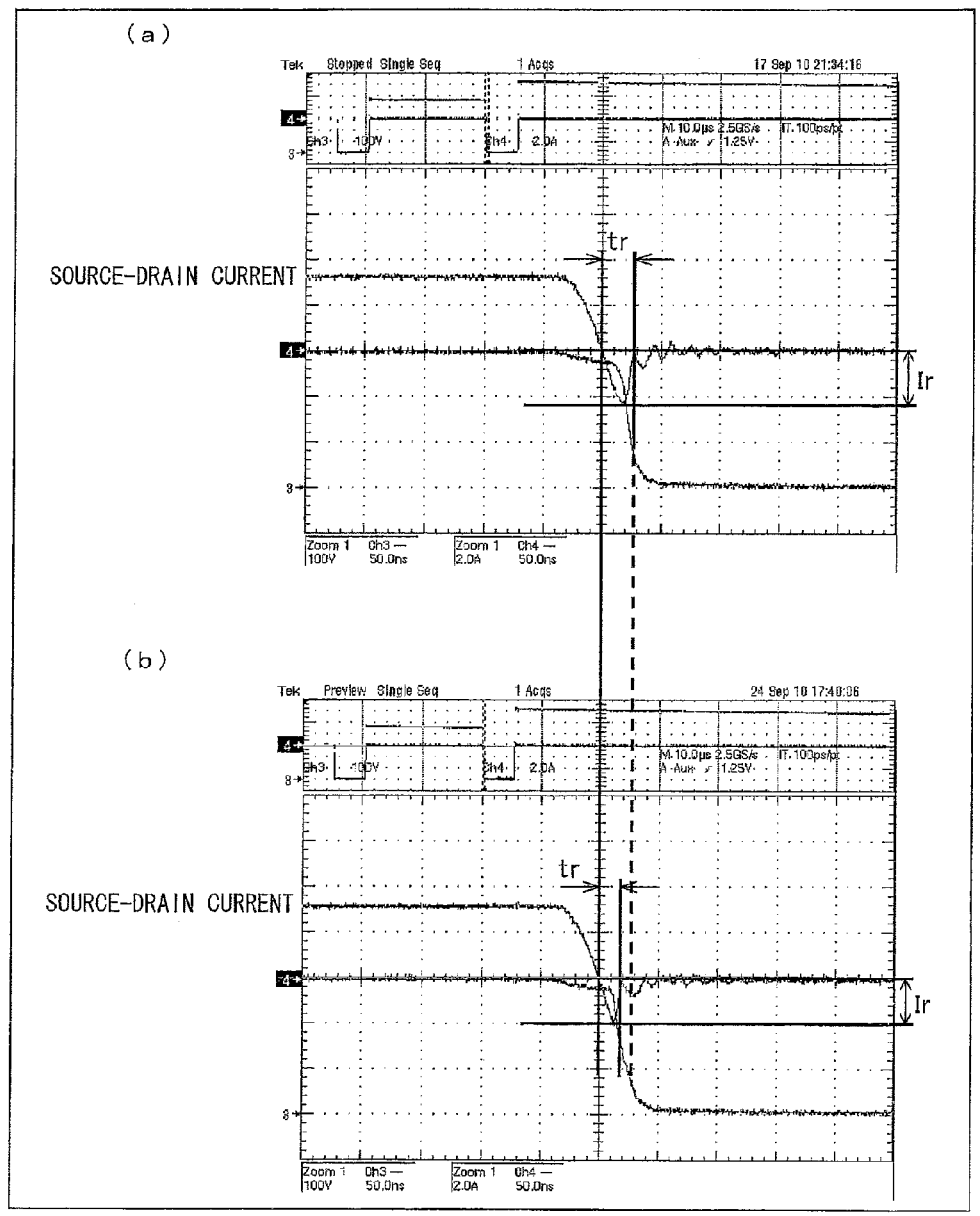
FIG. 12 is a waveform chart showing that a reduction in resistance of a resistor R121 causes a reduction in reverse recovery current and in reverse recovery time. (a) of FIG. 12 is a waveform chart corresponding to a case in which the resistor R121 has a resistance of 10Ω. (b) of FIG. 12 is a waveform chart the resistor R121 has a resistance of 0Ω.

FIG. 6 is a waveform chart showing that the semiconductor device 1 in accordance with the present embodiment has a reverse recovery current Ir and reverse recovery time tr which are reduced as compared with those of the conventional semiconductor device 121'. (a) of FIG. 6 is a waveform chart of the conventional semiconductor device 121' and (b) of FIG. 6 is a waveform chart of the semiconductor device 1 in accordance with the present embodiment. As is clear from (a) and (b) of FIG. 6, the semiconductor device 1 in accordance with the present embodiment has a reverse recovery current Ir that is reduced as compared with the conventional semiconductor device 121'. The reverse recovery time tr is also reduced in the semiconductor device 1 in accordance with the present embodiment.

(Specification of FET)

FIG. 7 is a view showing an example of a specification of the normally-on type FET 3. Due to being of a normally-on type, the normally-on type FET 3 has a gate threshold voltage (a threshold of a voltage to be supplied to the gate; a threshold voltage) which is a negative voltage (MIN: −5.0 V, MAX: −3.0 V). As such, the normally-on type FET 3 is turned on in a case where a voltage of 0 V is supplied to the gate.

FIG. 8 is a view showing an example of a specification of the normally-off type MOSFET 4. Due to being of a normally-off type, the normally-off type MOSFET 4 has a gate threshold voltage (a threshold of a voltage to be supplied to the gate; a threshold voltage) which is a positive voltage (MIN: 1.0 V, MAX: 2.5V). As such, the normally-off type MOSFET 4 is turned off in a case where a voltage of 0 V is supplied to the gate.

(Parameters of Semiconductor Device 1)

In the semiconductor device 1, time required to turn on the FET 3 (turn-on time) and time required to turn off the FET 3 (turn-off time) are each determined based on a time constant obtained by multiplying an input capacitance of the FET 3 by a resistance of the resistor Rgs. An optimum value of the time constant is determined, at the time of designing the semiconductor device 1, by determining a drain-gate capacitance or an internal gate resistance.

In the semiconductor device 1, (i) the gate drive current Ig1 flows through the resistor Rgs at the time of turning on and (ii) the gate drive current Ig2 flows through the diode D1 at the time of turning off. This allows a time constant at the time of turning on and a time constant at the time of turning off to be different from each other.

When the FET 3 is turned on, the following Formula (1) is met between (i) parameters of the semiconductor device 1 and a rate of change $dI_D/dt_{(on)}$ (i.e., di/dt) of an electric current $I_D$. The electric current $I_D$ is an electric current which flows from the source of the semiconductor device 1 to the drain of the semiconductor device 1.

[Formula 1]

$$\frac{dI_D}{dt_{(on)}} \propto \frac{1}{R_{gs}(C_{gs} + C_{dg})} \quad (1)$$

Like the electric current $I_D$, a relational expression is met also between (i) parameters of the semiconductor device 1 and (ii) a rate of change $dV_D/dt_{(on)}$ (i.e., dv/dt) of a voltage $V_D$, which is a voltage supplied to the source of the semiconductor device 1. The following Formula (2) is the relational expression.

[Formula 2]

$$\frac{dV_D}{dt_{(on)}} \propto -\frac{1}{(gR_{gs}C_{dg} + C_{D(all)})} \quad (2)$$

In Formulae (1) and (2), Cgs represents a gate-source capacitance and Cdg represents a drain-gate capacitance.

g represents a trans conductance of the FET. $C_{D(all)}$ is a sum of all of the parasitic capacitances connected with the drain of the semiconductor device 1, and includes a drain-source capacitance, a drain-gate capacitance, a coil parasitic capacitance, and the like.

It is clear from Formulae (1) and (2) that di/dt and dv/dt both decrease as the resistance of the resistor Rgs is increased.

Next, when the FET 3 is tuned off, the following Formulae (3) and (4) are met between (i) parameters of the semiconductor device 1 and (ii) a rate of change $dV_D/dt_{(off)}$ of the voltage $V_D$.

[Formula 3]

$$\frac{dV_D}{dt_{(off)}} \propto \frac{1}{(gR_{gs}C_{dg} + C_{D(all)})} \quad (3)$$

[Formula 4]

$$\frac{dV_D}{dt_{(off)}} \propto \frac{1}{C_{D(all)}} \quad (4)$$

Formula (3) corresponds to a case in which Rgs or Cdg is large and the FET 3 is turned off slowly (a case in which $R_{gs}C_{dg}I_L$ is larger than $C_{D(all)}V_{TH}$).

$I_L$ is an electric current that flows while the semiconductor device is in an on-state. $V_{TH}$ is a threshold voltage of the FET 3.

Formula (4) corresponds to a case in which Rgs or Cdg is small and the FET 3 is turned off slowly (a case in which $R_{gs}C_{dg}I_L$ is not more than $C_{D(all)}V_{TH}$).

As understood from Formulae (3) and (4), the rate of change $dV_D/dt_{(off)}$ decreases, according to Formula (3), as Rgs or Cdg is increased and, as a result, the rate of change $dV_D/dt_{(off)}$ is in proportion to a reciprocal of $C_{D(all)}$ as shown in Formula (4).

Note that the resistor Rgs can be fabricated on a chip of the semiconductor in the present Embodiment 1. This eliminates the need of mounting a resistor to a substrate when the semiconductor device 1 (composite element) is assembled. Accordingly, the number of components to be mounted on the substrate is reduced. This makes it possible to reduce costs.

An element manufactured by fabricating the resistor Rgs on the chip of the semiconductor is equivalent of the resistor Rgs. The element thus manufactured has electrical properties in which a semiconductor characteristic may be observed which is deviated from an ideal resistance characteristic.

Second Embodiment

Figure 3:
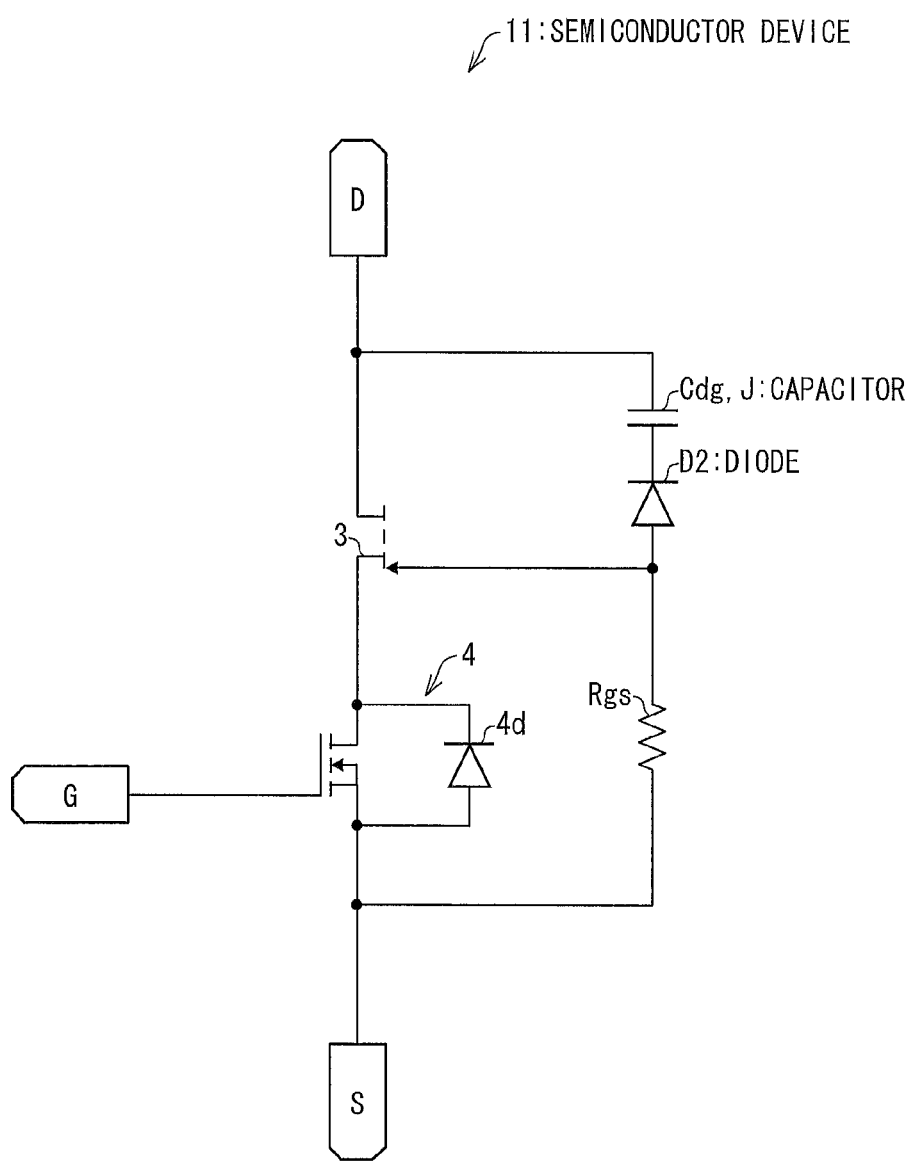
FIG. 3 is a circuit diagram of a semiconductor device in accordance with another embodiment of the present invention.
Figure 4:
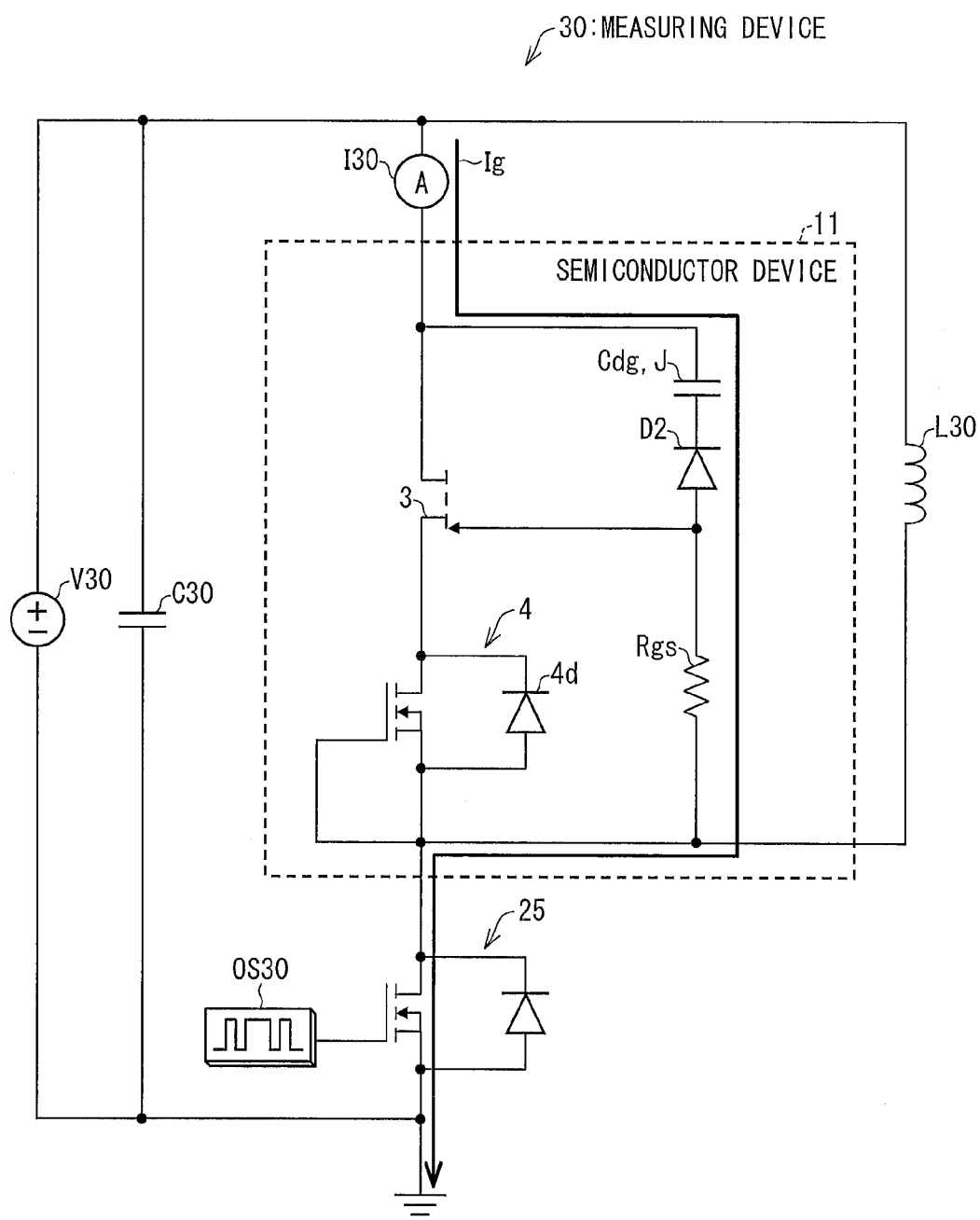
FIG. 4 is a circuit diagram of a measuring circuit for measuring a reverse recovery characteristic of a semiconductor device in accordance with another embodiment of the present invention.

The following description will discuss, with reference to FIGS. 3 and 4, another embodiment, Embodiment 2, of the present invention. Note that configurations of Embodiment 2 other than configurations to be described in Embodiment 2 are the same as those of early-described Embodiment 1. For easy explanation, the same reference signs will be given to members each having the same function as a member illustrated in the figures of Embodiment 1, and descriptions on such a member will be omitted.

(Configuration of Semiconductor Device 11)

FIG. 3 is a circuit diagram illustrating a semiconductor device 11 in accordance with the present embodiment. The semiconductor device 11 (i.e., a composite element) includes an FET 3, a MOSFET 4, a resistor Rgs, a diode D2, and a capacitor Cdg, J.

In the semiconductor device 11 illustrated in FIG. 3, a source of the MOSFET 4 and one end of the resistor Rgs are connected with each other. A diode 4d is a body diode which is present parasitically at the MOSFET 4.

A drain of the MOSFET 4, a cathode of the body diode 4d, and a source of the FET 3 are connected with one another.

The other end of the resistor Rgs, an anode of the diode D2, and a gate of the FET 3 are connected with one another.

A cathode of the diode D2 is connected with one end of the capacitor Cdg, J.

The other end of the capacitor Cdg, J and a drain of the FET 3 are connected with each other.

(Experiment for Measuring Reverse Recovery Characteristic)

(Measuring Circuit 30)

FIG. 4 is a circuit diagram illustrating a measuring circuit 30 for measuring a reverse recovery characteristic of the semiconductor device 11 in accordance with the present embodiment. The measuring circuit 30 has the same configuration as that of the measuring circuit illustrated in FIG. 2, except that a subject to be measured is different. That is, the subject to be measured by the measuring circuit 30 illustrated in FIG. 4 is the semiconductor device 11, and the measuring circuit 30 is a circuit for measuring a reverse recovery characteristic of a diode constituted by the MOSFET 4 of the semiconductor device 11.

In the measuring circuit 30 illustrated in FIG. 2, the other end of the coil L30, the one end of the resistor Rgs, the source of the MOSFET 4, a gate of the MOSFET 4, and a drain of a device FET 25 are connected with one another.

The other end of the resistor Rgs is connected with the anode of the diode D2 and a gate of the FET 3.

The cathode of the diode D2 is connected with the one end of the capacitor Cdg, J. The other end of the capacitor Cdg, J and the drain of the FET 3 are connected with an input of an ammeter I30. Other connections are the same as those in the measuring circuit 30 illustrated in FIG. 2.

(Measurement of Reverse Recovery Characteristic)

The following description will discuss measurement of a reverse recovery characteristic by use of the circuit illustrated in FIG. 4.

First, in the measuring circuit illustrated in FIG. 4, a high level signal is supplied from a signal generator OS30 to a gate of the device FET 25, so that the device FET 25 is turned on. This causes a power supply voltage (an output voltage of the voltage source V30) to cause an electric current to flow through the coil L30. Meanwhile, the semiconductor device 11 is in an off-state. That is, both of two FETs in the semiconductor device 11 are in an off-state.

In a case where the device FET 25 is turned off in a state in which the electric current flows through the coil L30, an electric potential of the drain of the device FET 25 (i.e., an electric potential of a source of the semiconductor device 1) is increased.

When the electric potential of the source of the semiconductor device 1 becomes substantially equal to the power supply voltage, the normally-on type FET 3 conducts.

When the electric potential of the source of the semiconductor device 1 increases to about a voltage equal to a sum of (i) a forward voltage of the body diode 4d of the normally-off type MOSFET 4 and (ii) the power supply voltage, the body diode 4d is turned on, so that the semiconductor device 11 is turned on. In response to the semiconductor device 11 being turned on, an electric current is regenerated, so that the electric potential of the source of the semiconductor device 1 stops increasing. A flow of a regenerated current which is regenerated when the semiconductor device 11 is turned on takes the following route: the one end of the coil L30→the other end of the coil L30→the source of the MOSFET 4→the drain of the MOSFET 4→the source of the FET 3→the drain of the FET 3→the ammeter I30.

This is an early stage of the measurement of the reverse recovery characteristic.

In order to measure the reverse recovery characteristic, the device FET 25 is turned on again in a state in which the regenerated current flows. This causes a gradual decrease in the regenerated current flowing in the semiconductor device 11. A rate of decrease of the regenerated current is di/dt.

When the regenerated current becomes zero, an electric current that is reverse to the regenerated current (i.e., a reverse recovery current (Ir in FIG. 6)) flows. A flow of the reverse recovery current takes the following route: the ammeter I30→the drain of the FET 3→the source of the FET 3→the drain of the MOSFET 4→the source of the MOSFET 4→the drain of the device FET 25→a source of the device FET 25→a ground (GND).

The semiconductor device 1 includes the diode D2 and the capacitor Cdg, J. As such, at the same time as the reverse recovery current flows, a gate drive current Ig flows in the following path: the ammeter I30→the capacitor Cdg, J→a parasitic capacitance of the diode D2→the resistor Rgs→the drain of the device FET 25→the source of the device FET 25→the ground (GND).

When the gate drive current Ig flows, the diode D2 is in an off-state. As such, the gate drive current Ig flows through a capacitor constituted by connecting the parasitic capacitance of the diode D2 and the capacitor Cdg, J in series.

The parasitic capacitance of the diode D2 is designed to be smaller than a capacitance of the capacitor Cdg, J. As such, the parasitic capacitance of the diode D2 accounts for a large proportion of the capacitor constituted by means of the serial connection (the parasitic capacitance of the diode D2 is dominant). That is, the parasitic capacitance of the diode D2 brings an effect similar to that brought about by a capacitor obtained by connecting the capacitor Cdg, J with a capacitor having a small capacitance.

As described above, the reverse recovery current and the gate drive current Ig flows simultaneously in the semiconductor device 1. As such, a decrease in electric potential of the drain of the device FET 25 (i.e., electric potential of the source of the semiconductor device 1), which decrease starts at the same time as the body diode 4d of the MOSFET 4 is turned off (i.e., recovers), occurs early as compared with the conventional semiconductor device. Accordingly, the semiconductor device 11 in accordance with the present embodiment is turned off more speedily than the conventional the semiconductor device. That is, the semiconductor device 11 in accordance with the present embodiment can achieve a reverse recovery characteristic better than that of the conventional semiconductor device.

The decrease in electric potential of the source of the semiconductor device 1 causes the body diode 4d of the MOSFET 4 to be turned off. This causes an increase in drain-source voltage of the MOSFET 4.

When a gate-source voltage of the FET 3 exceeds a negative threshold voltage and approaches 0 V, the FET 3 is turned off.

The electric potential of the drain of the device FET 25 (i.e., the electric potential of the source of the semiconductor device 1) decreases to a ground voltage. To be exact, the electric potential of the drain of the device FET 25 (i.e., the electric potential of the source of the semiconductor device 1) decreases to an on-voltage of the device FET 25.

In this manner, it is possible to observe the reverse recovery current from a time when the semiconductor device 11 is in an on-state until the semiconductor device 11 is turned off. That is, it is possible to measure the reverse recovery characteristic of the semiconductor device 11.

As described above, the semiconductor device 11 in accordance with the present embodiment includes the diode D2 and the capacitor Cdg, J. As such, in a semiconductor device including two FETs which are cascode-connection with each other, a reverse recovery current flows when an electric current flowing from a source of the semiconductor device to a drain of the semiconductor device is shut off. The reverse recovery current is a current which flows from the drain of the semiconductor device to the source of the semiconductor device. In addition to the reverse recovery current, the gate drive current Ig flows through the diode D2, the capacitor Cdg, J and the resistor Rgs.

A flow of the gate drive current Ig takes the following route: the capacitor Cdg, J→the parasitic capacitance of the diode D2→the resistor Rgs→the source of the MOSFET 4 (the drain of the device FET 25)→the source of the device FET 25→the ground (GND).

This allows the semiconductor device 11 to be turned off more speedily than the conventional semiconductor device. That is, a switching speed of the semiconductor device 11 increases.

Therefore, in the semiconductor device 11 in accordance with the present embodiment, time during which the reverse recovery current flows is shorter than that in the conventional semiconductor device. Consequently, it becomes possible to achieve a good reverse recovery characteristic.

In addition, since the semiconductor device 11 includes the diode D2 and the capacitor Cdg, J so as to cause the gate drive current Ig to flow, it becomes unnecessary to reduce, for the purpose of improving the reverse recovery characteristic, the capacitance of the capacitor Cdg, J. That is, it is only necessary that the capacitance of the capacitor Cdg, J be set to a value that is large enough to achieve good EMC (that is, not so large as to increase switching loss too much). This makes it possible to achieve good EMC and reduce the switching loss in the semiconductor device 11.

Further, unlike the conventional semiconductor device, there is no need of providing a negative power source (a voltage source for supplying a negative voltage) in order to cause the normally-on type FET 3 to operate. This makes the semiconductor device 11 less expensive than the conventional semiconductor device.

Therefore, it is possible to provide the semiconductor device 11 which can achieve a good reverse recovery characteristic and good EMC at the same time and is less expensive than the conventional semiconductor device.

(Parameters of Semiconductor Device 11)

In the semiconductor device 11 in accordance with the present embodiment, time required to turn on the FET 3 (turn-on time) and time required to turn off the FET 3 (turn-off time) are each determined based on a time constant obtained by multiplying an input capacitance of the FET 3 by a resistance of the resistor Rgs, as in the semiconductor device 1 of Embodiment 1.

As such, when the FET 3 is turned on, the formulae (1) through (4) described in Embodiment 1 are met with respect to parameters of the semiconductor device 11.

Note that the semiconductor device 11 in accordance with the present embodiment includes the capacitor Cdg, J. Addition of the capacitor Cdg, J brings about an effect substantially equal to that brought about by an increase in drain-gate capacitance Cdg.

As such, as understood from Formula (1), the rate of change $dI_D/dt_{(on)}$ (i.e., di/dt) of an electric current $I_D$ decreases due to the capacitor Cdg, J when the FET 3 is turned on. Similarly, as understood from Formula (2), the rate of change $dV_D/dt_{(on)}$ (i.e., dv/dt) of a voltage $V_D$ decreases due to the capacitor Cdg, J.

As understood from Formulae (3) and (4), when the FET 3 is turned off, the rate of change $dV_D/dt_{(off)}$ decreases, according to Formula (3), if the capacitor Cdg, J is added (that is, Cdg is increased) and, as a result, the rate of change $dV_D/dt_{(off)}$ is in proportion to a reciprocal of $C_{D(all)}$ as shown in Formula (4).

(Selection of Time Constant)

Each of the semiconductor device 1 of the First Embodiment and the semiconductor device 11 of the Second Embodiment is different from the conventional cascode circuit disclosed in Non-patent Literature 1, in that a diode is added.

By adding the diode, the time constant, based on which the switching speed is determined, becomes different between a case in which a turning on is carried out and a case in which a turning off is carried out. Specifically, a time constant in the case of turning off is made smaller than a time constant in the case of turning on.

This caused an increase in speed of turning off and, accordingly, brought about an improvement in reverse recovery characteristic. Note that the time constant in the case of turning on can be adjusted independently of the time constant in the case of turning off (the time constant in the case of turning on is adjusted at the time of designing). This makes it possible to select a time constant by taking EMC into consideration.

The following description will concretely discuss significance of reduction in time constant.

In the semiconductor device 1 of the First Embodiment, a gate drive current flows via the diode D1 in a case of turning off. Because of this, the gate drive current brings about an effect similar to that brought about by a reduction in resistance of a gate resistance of the FET 3.

Since this causes an increase in gate drive current in the case of turning off, an electric charge is extracted faster from the input capacitance of the FET 3. As a result, switching is carried out faster.

In the semiconductor device 11 of the Second Embodiment, the gate drive current Ig flows via the parasitic capacitance of the diode D2, so that a gate-drain capacitance of the FET 3 is decreased. This causes a reduction in input capacitance of the FET 3, so that the number of electric charges which are extracted is reduced. As a result, switching is carried out faster.

In the semiconductor device, the diode can be a Schottky junction diode formed by joining (i) an electrode of the source of the second field-effect transistor and (ii) a semiconductor with each other.

In this case, the second field-effect transistor and the diode can be fabricated on the same chip. This makes it possible to reduce a cost as compared with a case in which the second field-effect transistor and the diode are separately mounted.

In addition, the diode provided as a Schottky junction diode is turned on in less time than that required to turn on the diode provided as a PN junction diode. This makes it possible to cause the gate drive current to flow sooner so as to turn off the semiconductor device speedily.

In the semiconductor device, the first field-effect transistor can contain a group III nitride semiconductor. This allows the first field-effect transistor to be a normally-on type field-effect transistor and also allows a high resistance to pressure, a high-speed operation, a high heat-resistance, and a low on-resistance to be achieved in the first field-effect transistor.

In the semiconductor device, the resistor can be fabricated on a chip of the semiconductor.

This eliminates the need of mounting a resistor to a substrate when the semiconductor device (composite element) is assembled. Accordingly, the number of components to be mounted on the substrate is reduced. This makes it possible to reduce costs.

(Example of Application)

An electronic device of the present invention includes one of the semiconductor devices 1 and 11. Therefore, the electronic device of the present invention (i) can achieve a good reverse recovery characteristic and good EMC at the same time and (ii) is less expensive than a conventional semiconductor device.

The present invention is not limited to the above-described embodiments but allows various modifications within the scope of the claims. Any embodiment obtained by appropriately combining the technical means disclosed in the different embodiments will also be included in the technical scope of the present invention.

INDUSTRIAL APPLICABILITY

A semiconductor device of the present invention can be applied to an electronic device. The semiconductor device of the present invention can be suitably applied to an inverter circuit which has a problem of loss of reverse recovery characteristic.

REFERENCE SIGNS LIST

1 and 11: semiconductor device
3: FET (first field-effect transistor)
4: MOSFET (second field-effect transistor)
4d: body diode
Cdg, J: capacitor
D1: diode
D2: diode
Ig: gate drive current
Ig1: gate drive current
Ig2: gate drive current
Ir: reverse recovery current
Rgs: resistance
tr: reverse recovery time

The invention claimed is:

1. A semiconductor device comprising:
   a first field-effect transistor being of a normally-on type;
   a second field-effect transistor being of a normally-off type and having a drain thereof connected with a source of the first field-effect transistor;
   a resistor having one end thereof connected with a gate of the first field-effect transistor and having the other end thereof connected with a source of the second field-effect transistor;
   a diode having an anode thereof connected with the gate of the first field-effect transistor; and
   a capacitor having one end thereof connected with a drain of the first field-effect transistor and having the other end thereof connected with a cathode of the diode,
   wherein the diode and the capacitor are directly connected in series with each other.

2. The semiconductor device as set forth in claim 1, wherein the first field-effect transistor contains a group III nitride semiconductor.

3. The semiconductor device as set forth in claim 1, wherein the resistor is fabricated on a chip of a semiconductor.

4. An electronic device comprising a semiconductor device, the semiconductor device including:
a first field-effect transistor being of a normally-on type;
a second field-effect transistor being of a normally-off type and having a drain thereof connected with a source of the first field-effect transistor;
a resistor having one end thereof connected with a gate of the first field-effect transistor and having the other end thereof connected with a source of the second field-effect transistor;
a diode having an anode thereof connected with the gate of the first field-effect transistor; and
a capacitor having one end thereof connected with a drain of the first field-effect transistor and having the other end thereof connected with a cathode of the diode,
wherein the diode and the capacitor are directly connected in series with each other.

* * * * *